United States Patent [19]

Welsch et al.

[11] 4,385,781
[45] May 31, 1983

[54] CARRIER FOR PRINTED CIRCUIT BOARDS

[75] Inventors: John H. Welsch, Moscow; Robert J. Carver, Nanticoke, both of Pa.

[73] Assignee: Metropolitan Wire Corporation, Wilkes-Barre, Pa.

[21] Appl. No.: 236,615

[22] Filed: Feb. 20, 1981

[51] Int. Cl.³ .............................................. B25H 3/04
[52] U.S. Cl. .................................... 294/161; 211/41; 294/143; 294/162
[58] Field of Search ...................... 294/87 R, 137, 143, 294/159–163; 206/510, 511, 513; 211/41, 49 R, 126, 184, 187, 188, 175, 207; 220/19, 95

[56] References Cited

U.S. PATENT DOCUMENTS

| | | | |
|---|---|---|---|
| 2,662,662 | 12/1953 | Moorhead | 220/19 |
| 3,014,594 | 12/1961 | Kerstner | 211/41 |
| 3,202,295 | 8/1965 | Drader | 211/126 |
| 3,349,924 | 10/1967 | Maurer et al. | 211/41 |
| 3,465,891 | 9/1969 | De Rose | 211/41 |
| 3,640,399 | 2/1972 | Hartman | 211/175 |
| 4,079,836 | 3/1978 | Stein et al. | 211/126 X |
| 4,321,654 | 3/1982 | Nakajo et al. | 211/41 X |
| 4,328,898 | 5/1982 | Grassi | 211/41 |

Primary Examiner—Johnny D. Cherry
Attorney, Agent, or Firm—Goodman & Teitelbaum

[57] ABSTRACT

A carrier for printed circuit boards formed of a substantially rectangular configuration having a pair of spaced apart opposing panels coupled between a pair of skeletal wire frames. Coupling devices are provided for adjustably coupling corresponding ends of each of the panels to the frames to thereby permit adjustment of the spacing between the panels. A plurality of spaced apart elongated guides are correspondingly formed on the panels for receiving opposing edges of circuit boards which are supported between the panels. Support devices are integrally formed at the opposing ends of each of the frames for providing a variety of types of supports for the carrier. At the same time, the support devices are utilized for providing an interlocking relationship between adjacent carriers for permitting vertical stacking of the carriers.

16 Claims, 13 Drawing Figures

CARRIER FOR PRINTED CIRCUIT BOARDS

BACKGROUND OF THE INVENTION

This invention relates to a carrier for printed circuit boards, and more particularly to a lightweight, durable carrier which can be adjusted to accommodate circuit boards of differing depths and widths, and which facilitates stacking and transporting of the circuit boards.

Printed circuit boards are used extensively in all types of electrical equipment. Such circuit boards are formed as substantially uniformly shaped cards which are stacked together in the equipment. During the course of fabrication or of actual use, it is often necessary to handle a large number of the boards simultaneously. For this purpose it is best to provide for a carrier which can stack the printed circuit boards uniformly with respect to each other at sufficiently spaced apart locations to avoid interference from one board to the next one.

The circuit boards occasionally have to be stored or transported in a vertical orientation, while in other situations a horizontal orientation is more appropriate. Furthermore, the types of support available for the carrier will substantially differ depending upon the particular type of transportion or use required for the printed circuit boards.

By way of example, during production of the circuit boards themselves, they generally may be handled either vertically or horizontally. However, if they are wet from processing, vertical orientation is generally preferred to permit drainage. At this stage of the production, the circuit boards can be placed closer together but still cannot touch each other. Because of the closer arrangement, denser storage is facilitated which results in more efficient use of the space.

From the time when the components are placed on the circuit board until they are suitably soldered, the boards must be generally kept in a horizontal plane to prevent dislocation of the components. After the components are soldered, the boards again may be transported either horizontally or vertically.

In any event, the boards may be securely held during all the various fabrication procedures while preventing them from shifting or sliding out from the carrier.

During the course of their production, or prior to actual use, the printed circuit boards require transportation from one facility to the next. Such transportation may occur by various means. For example, when they are transported for long distances, they may be placed in a van from one manufacturing location to another. Where security is important, they may be placed in an enclosed cabinet. Occasionally, for storing them at a particular facility, they may be placed on various types of stationary shelving. Such shelving may be solid, formed of a series of rails, or may contain undershelf slides from which the carrier will depend. Of course, in transporting the carriers, it is necessary to grasp them either manually or automatically to move them about. The carrier must also be suitable manufactured for placement on a support surface.

An additional requirement for suitable carriers is that they permit adjustability for different types and sizes of printed circuit boards. Although in a particular situation printed circuit boards of a common size will be stacked together, nevertheless from one application to the next, the size of the circuit boards may vary and accordingly the carrier must be adjustable to accommodate such variability in size of the printed circuit boards. The size itself may vary in either the width or depth dimensions of the circuit boards. Furthermore, although a carrier may be of the size limited to retain a specific number of stacked boards, where many boards must be transported or undergo a common manufacturing operation, it is desirable to facilitate stacking of one carrier on the next in a secure stacking relationship.

At present there are numerous types of carrier available for printed circuit boards. Some of these are in the form of baskets, others form cabinets, or similar solid type containers. Many of these are inflexible and cannot be adjusted to accommodate the different sized printed circuit boards. Still other types of carriers have complex designs which add weight to the carrier and often present problems in manipulating the carriers. This is especially a problem when hand carrying of the carrier is required. It is also a problem where various types of manufacturing operations are needed on the printed circuit boards, such as baking, and extra precautions must be taken to accommodate the excessive weight of the carrier or handling basket which holds the boards during this process.

Of course, one of the most difficult problems with prior art devices is that they often do not provide for suitable adjustability. While they may provide some capability for adjustment, in one varying dimension of the printed circuit board, there is insufficient versatility to utilize these carriers. It is necessary for a carrier to be adjustable and accommodate circuit boards where both the width and depth dimension can vary. Furthermore, stackability of the carriers is an important requirement, often not achievable with prior art designs.

One of the most important problems of prior art designs concerns the ability to transport the carriers. While handles may be provided on some devices, such handles are often insufficient for the varied types of transporting means available. While such handles may be usable for vans, they may be unsuited for shelves or other storage facility.

SUMMARY OF THE INVENTION

It is accordingly an object of the present invention to provide a carrier for printed circuit boards which avoids the problems of the prior art devices.

A further object of the present invention is to provide a carrier for printed circuit boards which can be adjusted to accommodate varying sizes of width and depth of the printed circuit boards.

Yet another object of the present invention is to provide a carrier for the printed circuit boards which can be easily stacked onto other similar carriers.

A further object of the present invention is to provide a carrier for printed circuit boards having a support mechanism which facilitates supporting the carrier for numerous types of support requirements.

Another object of the present invention is to provide carriers for printed circuit boards which permit vertical stacking of the carriers, one upon the other, and also permit lateral coupling of one carrier adjacent to the next.

A further object of the present invention is to provide a carrier for printed circuit boards which is lightweight, durable, adjustable, simple to manufacture and easy to utilize.

Still a further object of the present invention is to provide a carrier for printed circuit boards which can be utilized for orienting the printed circuit boards in either a vertical or a horizontal direction.

Briefly, in accordance with the present invention, there is provided a carrier for printed circuit boards which includes a substantially rectangular configuration formed of a pair of variably spaced apart opposing panels and a pair of skeletal frames on the opposing sides of the panels. A plurality of spaced apart elongated card guides are correspondingly formed on each of the panels. Correspondingly opposed ones of the card guides receive the opposing edges of a circuit board to support the board in a substantially perpendicular relationship between the panels. A coupling mechanism is provided for adjustably coupling the corresponding ends of each of the panels, respectively, to each of the frames. This permits adjustment of the spacing between the panels so as to accommodate different widths of circuit boards. Support devices are provided on the opposing ends of each of the frames in order to provide varied support arrangements for the carrier. The same support devices are utilized for receiving complementary support devices of another carrier in an interlocking relationship to permit stacking of one carrier upon the next.

In one embodiment of the invention, an upper and lower frame is provided, with the panels serving as side panels in order to orient the printed circuit boards horizontally.

In another embodiment, side frames are provided, with the panels serving as the upper and lower members, to thereby orient the circuit boards in a vertical orientation.

The upper supports on the frame are laterally extending, U-shaped handle bars, while the lower supports are substantially U-shaped feet. A tie bar respectively spans across the legs of the U-shaped handle bars as well as across the legs of the U-shaped feet. The legs of the U-shaped feet are inwardly directed from the sides of the panels. In this way, the U-shaped feet of one carrier can fit into the handle bars of another carrier therebeneath, with the tie rods of the two carriers respectively abutting each other to thereby facilitate stacking of the carriers.

The card guides are formed by lips which are struck from the surface of the panel to define a passageway therebetween.

By means of a U-shaped channel overlying the upper edges of laterally adjacent panels, the panels can be placed adjacent to each other in a common plane so as to interconnect one carrier laterally adjacent to the next carrier, thereby accommodating varied depth requirements of the printed circuit boards.

Retaining members are placed onto the front and rear of the panels to insure retention of the circuit boards in the carrier and prevent their sliding out of the carrier.

BRIEF DESCRIPTION OF THE DRAWINGS

With the above and additional objects and advantages in view, as will hereinafter appear, this invention comprises the devices, combinations and arrangements of parts hereinafter described by way of example and illustrated in the accompanying drawings of a preferred embodiment in which.

In the various figures of the drawing, like reference characters designate like parts.

DETAILED DESCRIPTION OF THE PREFERRED EMBODIMENT

Figure 1:
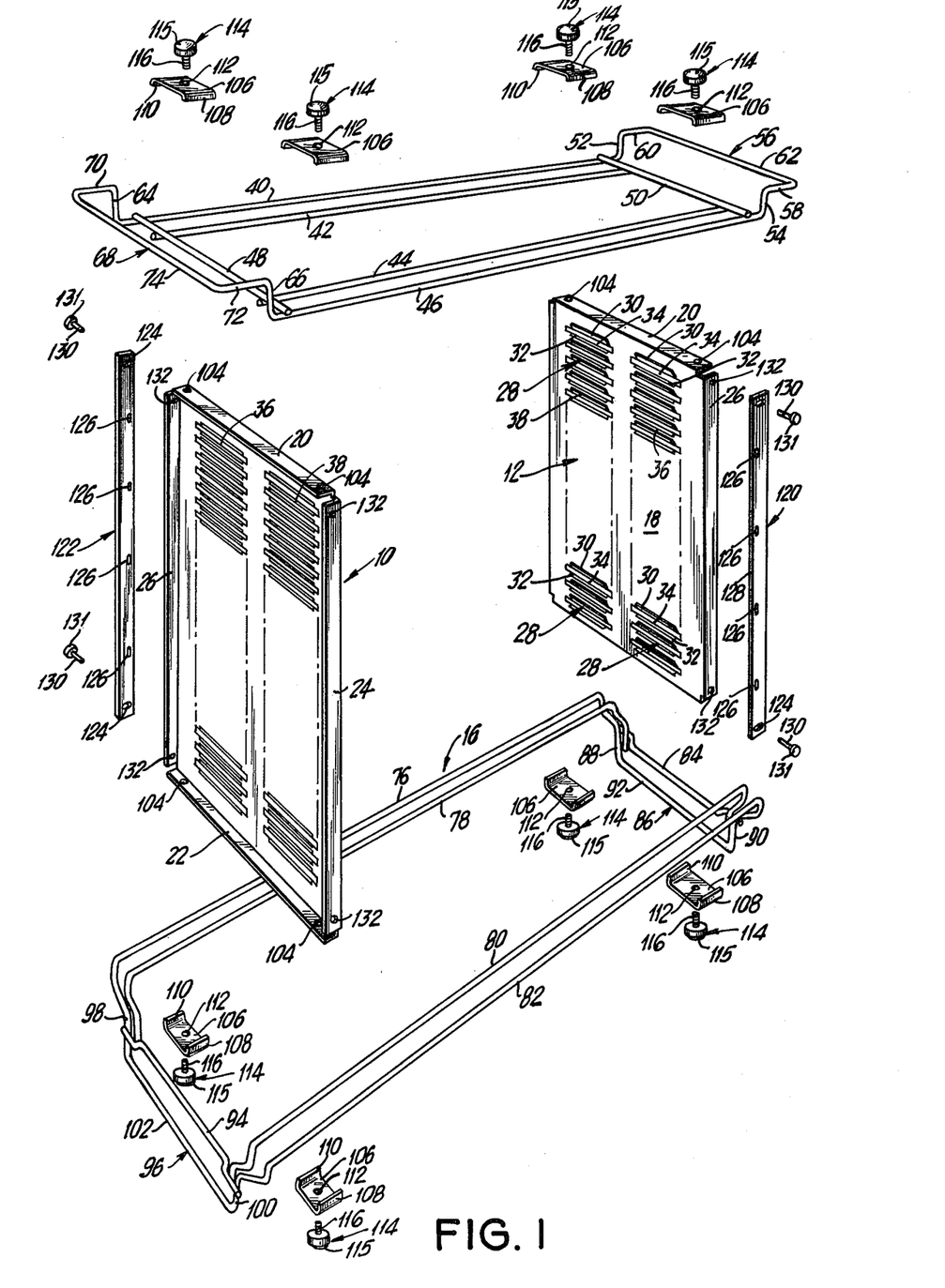
FIG. 1 is an exploded perspective view of the various parts forming the printed circuit board carrier, in accordance with a first embodiment of the present invention.
Figures 2, 3, 4, 5, 6, 7:
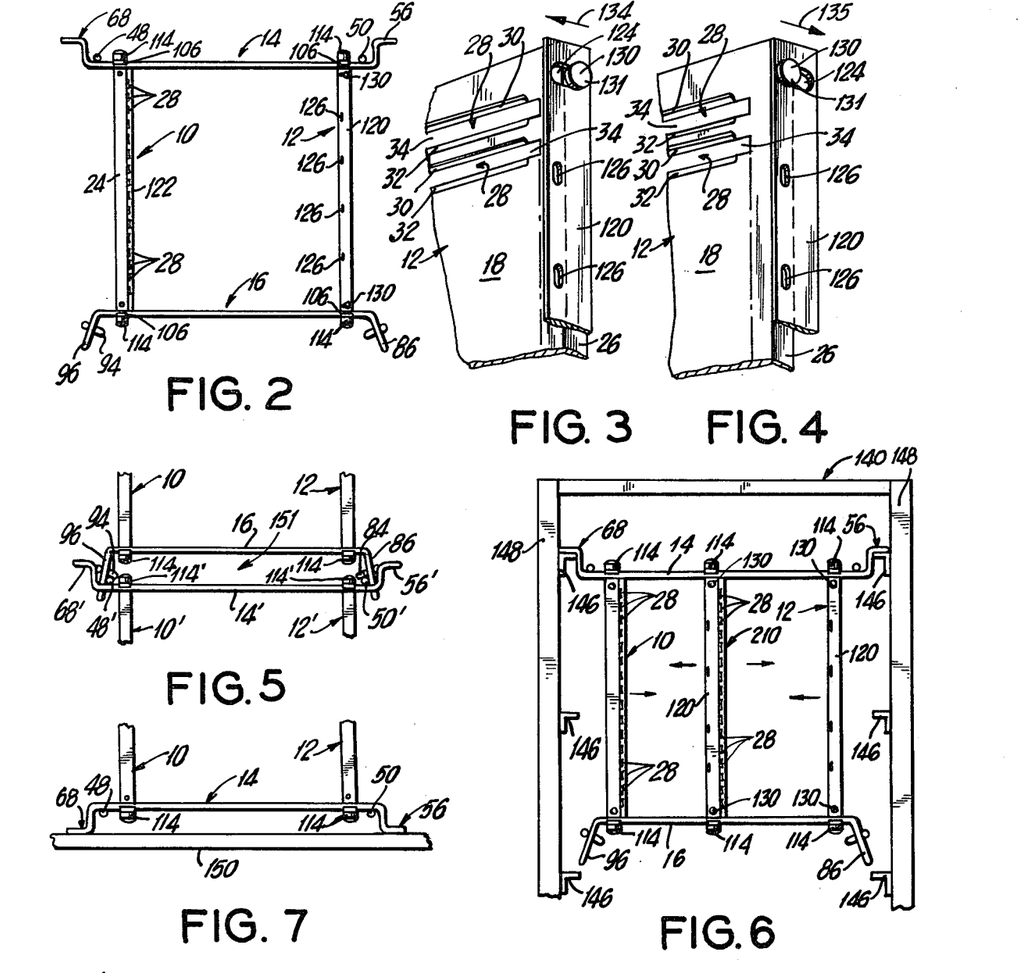
FIG. 2 is an elevational side view showing the assembled carrier of FIG. 1.
FIG. 3 is a fragmented perspective view showing the retaining member adjacent the side edge of the panel, the retaining member being shown in its closed or retaining position.
FIG. 4 is a view similar to that shown in FIG. 3 showing the retaining member in its open or released position.
FIG. 5 is a fragmented elevational view showing one carrier stacked upon the next in interlocking relationship.
FIG. 6 is an elevational view showing a carrier arrangement of two different sized columns of circuit boards, with the carriers being supported from shelves in a cabinet.
FIG. 7 is a fragmented elevational view showing the carrier inverted to use the upper end as a lower support.

Referring now to FIGS. 1 and 2, a first embodiment of the carrier is shown to include side panels 10 and 12 which are spaced apart and interconnected to an upper skeletal wire frame 14 and a lower skeletal wire frame 16.

Each of the side panels 10, 12 are substantially identical and include a front surface 18 with a peripheral flange thereabout including the upper and lower flange sections 20 and 22, and the side flange sections 24 and 26. The corners interconnecting adjacent flange sections are notched to permit the bending over of the flanges. The flanges are bent outwardly from the front surface 18.

On each of the panels are formed card guides 28 which receive the edges of the printed circuit boards inserted therein. Each card guide is a longitudinally formed slot, defined by upper and lower lips 30, 32 which are struck or formed from the panel surface and respectively flare upwardly and downwardly from a central passageway 34. For convenience, the elongated slots are divided into two columns with the first column 36 being spaced from the second column 38. Corresponding ones of the slots in column 36 are colinear with slots in column 38. Furthermore, since the two planes 10, 12 are substantially identical, when interconnected in spaced relationship, opposing slots of panels 10 and 12 will lie in a common plane so that a printed circuit board inserted in such common coplanar slots will be held spaced between the panels 10 and 12 and in substantially perpendicular relationship therewith.

Utilizing the side panels 10, 12, it is possible to store a plurality of horizontally oriented printed circuit boards with their edges being securely held in the card guides 28 defined between the lips 30, 32 on each of the side panels.

The upper frame 14 includes a first pair of spaced apart guide rails 40, 42 to define a first side edge of the frame 14. A second pair of guide rails 44, 46 are similarly spaced apart to define the opposing side edge of the frame 14. All of the four guide rails lie in a common horizontal plane. The opposing ends of the guide rails are respectively interconnected by transverse, parallel spaced apart tie rods 48, 50 which overlie the guide rails. The inner guide rails 42, 44 terminate at these tie rods. However, the outer guide rails integrally extend into a support handle. At the right end as shown in FIG. 1, the outermost guide rails 40, 46 respectively continue into the upwardly extending arms 52, 54 which then continue into the horizontal U-shaped handle bar 56 which includes the opposing leg portions 58, 60 and the integral bight portion 62. Similarly, at the left end as shown in FIG. 1, the guide rails 40, 46 extend into the upwardly directed arms 64, 66 which also interconnect to an integral U-shaped handle bar 68 having the opposing leg portions 70, 72 and the integral bight portion 74. The handle bars 56, 68 lie in a common plane which is vertically offset from the plane of the guide rails 40, 42 and 44, 46.

The lower frame 16 includes a first pair of spaced apart guide rails 76, 78 which define one side edge of the frame. A corresponding pair of guide rails 80, 82 define the opposing side edge of the frame. All of the four guide rails 76, 78 and 80, 82 lie in a common horizontal plane. The spacing between each respective pair of guide rails 76, 78 and 80, 82 is substantially identical and is also substantially identical to the spacing between each pair of guide rails 40, 42 and 44, 46 in the upper frame. Furthermore, the spacing between the inner guide rails 78, 80 of the lower frame 16 is substantially identical to the spacing between the inner guide rails 42, 44 of the upper frame 14.

At the right end of the lower frame 16, as shown in FIG. 1, the guide rails are first bent downwardly slightly less than 90°, and then inwardly directed and both the outer and inner guide rails being bent toward the center in a curved arrangement. The curved rails are then again bent downwardly at the same above angle at their end portions. A tie rod 84 is spaced inwardly between the downwardly bent ends of the guide rails with the opposite ends of the rod 84 being bent outwardly for securement against the outside surfaces of the guide rails bent ends. The inner guide rails 78, 80 terminate at such tie rod 84. The outer rails 76, 82 continue downwardly into a U-shaped foot portion 86 having opposing leg portions 88, 90 interconnected by an integral bight section 92. The angle between the horizontal guide rails 76, 78 and 80, 82 and the foot portion 86 is best shown in FIG. 2.

At the left end of the lower frame 16, as shown in FIG. 1, there is a similar arrangement with the ends of the guide rails being bent into a downward direction slightly less than 90°, and being inwardly directed in a curved arrangement. The inner guide rails 78, 80 terminate at the inwardly spaced tie rod 94 having its opposite ends bent outwardly for securement thereto in the same manner as rod 84, while the outer guide rails 76, 82 continue downwardly into the U-shaped foot portion 96 including the opposing leg sections 98, 100 and the integral bight portion 102. Reference again is made to FIG. 2 to show the angle between the horizontal guide rails 76, 78 and 80, 82 and the foot portion 96.

On the upper and lower flanges 20, 22 of the side panels 10, 12, and adjacent the distal ends of such flanges, there are provided threaded openings 104. The threaded openings 104 are alignable between the respective pairs of guide rails. U-shaped clips 106 having legs 108, 110 overlie the guide rails, each including an aperture 112 in alignment with the threaded opening 104. Knobs 114, each having an enlarged head 115 and threaded stud 116, tighten the clips into the guide rails and hold the panels in place, where the threaded stud 116 passes through the clip aperture 112 and is threaded into the panel threaded opening 104. Accordingly, the spacing between the pair of panels 10, 12 can be adjusted to a desired width of the printed circuit boards. It should be noted that the various clips and knobs are all identical so as to permit them to be interchangeable.

In order to retain the circuit boards positioned within the card guides 28 on the panels 10, 12 and prevent them from sliding out, retaining members or bars 120, 122 are utilized and are placed on diametrically opposed sides of the pair of panels, such as on the side flange section 26 of each panel 10, 12. Each of the retaining members 120, 122 is a flat strip and includes elongated slots 124 at their opposing upper and lower ends. The length dimension of the slots 124 is perpendicular to the elongated body of the retaining member itself. Inwardly directed dimples 126 are vertically spaced apart along one side edge 128 of the retaining members. It should be noted that the retaining members are substantially identically formed and are accordingly interchangeable. The retaining members are held fastened to the side flange section 26 of the panels 10, 12 by means of rivets, or pins 130 which are inserted through the elongated slots 124 and pass through apertures 132 formed at the opposing ends of the side flange section 26, and also the side flange section 24 is required. The inner ends of the rivets or pins 130 are flattened and secured in place against the inner side of the side flange sections to prevent their removal. An enlarged head 131 is provided on the opposite outside end of each rivet or pin 130 to hold the retaining members 120, 122 in their selection position, as set forth below.

The retaining members 120, 122 have sufficient play to permit them to slide leftward and rightward with the rivet 130 riding in the elongated slots 124. As shown in FIG. 3, the retaining member 120 can be moved leftward, as shown by arrow 34, along the surface of the flange section 26 so that the dimples 126 snap forward of the edge of the flange section 26 and catch onto the front surface 18 of the panel 12. The front edge of the retaining member 120 will then lie forward of the panel surface 18 and act as a retainer to prevent the printed circuit boards from sliding out of the passageways 34. When it is desired to remove some of the boards, the bar 120 is slid rearward, as shown by the arrow 135 in FIG. 4, whereby the dimples 126 ride onto the surface of the flange section 26 and tightly hold the retaining member in its release or inactive position. It should be noted that the retaining members 120, 122 have inherent resiliency which permit them to slightly deform when moving them from their retaining to their release positions. In the release position, the circuit boards can be slid out from the card guide passageways 34.

When assembled, the carrier, as shown in FIG. 2, can receive printed circuit boards inserted between the panels with the edges of the circuit boards being received in the card guides 28 formed on the panels. The spacing between the panels can be suitably adjusted by releasing the knobs 114 to make the space between the side panels sufficient to accommodate the suitable width of the printed circuit boards being carried. The integral support means on the frames can be utilized to suitably transport, stack, and hold the carrier. For example, the upper handles 56, 68 can be utilized for grasping the carrier and manually holding it and transporting it from place to place. The feet 86, 96 can be used as a stand for placing the carrier on a support surface. At the same time, the handles 56, 68 can be placed onto shelves for storage or transportation in a van or other carrier. It can be placed in an enclosed cabinet, as shown in FIG. 6, the cabinet 140 having flanges or angle members 146 slightly protruding from the side walls 148 of the cabinet 140, and the handles 56, 68 serving as holders or supports for placement onto the flanges 146.

The use of the various support means provided by the upper and lower frames provide a versatility for supporting and transporting the carrier. They can be placed on stationary shelving, placed on a shelf truck, utilized in baskets, placed on solid support surfaces, rail support surfaces, shelving, etc. Additionally, undershelf slides which are frequently mounted on the lower surface of shelves, can also be utilized for supporting the carriers by placing the handles 56, 68 into such undershelf slides.

Additionally, the carrier can be inverted with the upper frame 14 now serving as the base, as shown in FIG. 7. In such case, the handles 56, 68 actually serve as legs for the carrier. These legs can then be placed on a support surface 150. Because the handles 56, 68 are vertically offset from the plane of the guide rails, the ends of the panels will be spaced from the support surface 150 and the knobs 114 are still available for adjustment of the panels to their desired spaced apart positions.

In addition to serving as versatile support devices, the handles and feet are also utilized to provide an interlocking relationship for stacking one carrier upon the other in a vertically stacked arrangement. As shown in FIG. 5, a first carrier of panels 10, 12 has its lower frame 16 positioned with its feet 86, 96 inserted in interlocking relationship between the upper frame 14' of another carrier of panels 10', 12' therebeneath. The lower carrier receives the feet 86, 96 of the upper carrier into its handles 56', 68'. The bight portions of the handles 56', 68' are horizontally outward of the downward extension of the feet 86, 96 so as to receive the feet 86, 96 therebetween. Additionally, because the feet 86, 96 are inwardly bent from the sides of the lower frame, as shown in FIG. 1, they can fit between the width of the handles 56', 68'.

The interlocking relationship is such that the central portions of the tie bars 84, 94 across the feet 86, 96 will contiguously abut the tie bars 48', 50' across the handles 68', 56'. Specifically, as shown in FIG. 5, the central portions of the tie bars 84, 94 across the feet 86, 96 overlie and function to cradle the tie bars 50', 48' across the handle bars 56', 68', wherein the axes of the tie bars 84, 94 are slightly closer together than the axes of the tie bars 50', 48'. It should be noted, that because of the positioning of the tie bars 84, 94 at a point spaced from the guide rails 76, 78 and 80, 82 of the lower frame 16, a space 151 is provided between the adjacently stacked carriers so as to permit suitable adjustment of the panels by means of manipulating the various knobs 114, 114' without removing the carriers from their stacked arrangement. As a result, even though the vertically stacked carriers are loaded with circuit boards, it is not necessary to empty the carrier before making width adjustments to one of the carriers.

Because of the ability to adjust the positioning of the panels, it is possible to move the panels closer together so as to permit the addition of two more panels so that two columns of circuit boards can be supported while utilizing the same upper and lower frames. However, instead of adding two more panels, a center panel can be modified to function as two panels. As shown in FIG. 6, between the upper frame 14 and the lower frame 16 there is provided a leftmost panel 10, a rightmost panel 12 and a center panel 210 to form two columns of circuit boards. The center panel 210 is similar to panels 10, 12 except that it has two front surfaces spaced apart by the peripheral flange so that the card guides 28 extend outwardly from each of the two front surfaces. Accordingly, the center panel 210 can easily be formed by modifying one of the panels 10, 12 to fit within the other panel so that the front surfaces 18 of each panel faces outwardly and the threaded openings 104 and the apertures 132 are respectively in alignment, wherein other modifications are also possible. The outward directions of the card guides 28 are shown by the arrows in FIG. 6.

Because of the adjustability, the carriers permit accepting circuit boards having various widths. The knobs 114 are simply loosened and the panels are brought to a suitable spacing so as to accommodate the desired width of the printed circuit boards. At the same time, the carriers can be stacked so as to permit more circuit boards to be accommodated by utilizing additional carriers with each one interlockingly stacking into the next carrier therebeneath.

Figure 8:
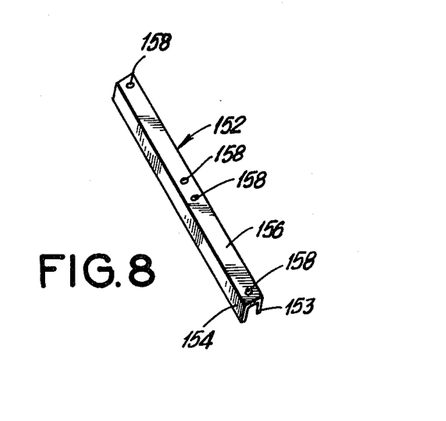
FIG. 8 is a perspective view of a coupling bar for holding laterally adjacent carriers.

In order to accommodate circuit boards of different depths, an interconnecting coupling bar 152 is utilized, as shown in FIG. 8. The coupling bar is formed as a U-shaped channel having spaced apart legs 153, 154 and an interconnecting bight portion 156. Formed through the bight portion are a series of apertures 158. The apertures 158 are spaced apart so as to align with the threaded openings 104 formed through the flanges on the panels in order for the threaded studs 116 of the knobs 114 to pass therethrough as set forth below.

Figure 9:
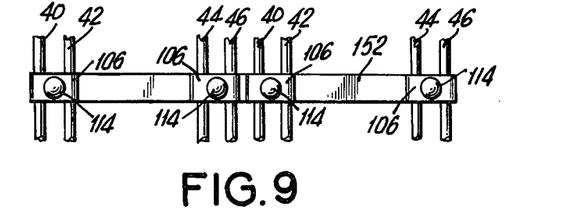
FIG. 9 is a fragmentary top view showing the coupling bar of FIG. 8 holding adjacent, laterally positioned carriers.
Figure 10:
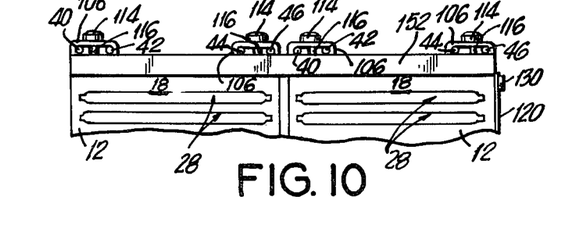
FIG. 10 is a fragmentary elevational view of the arrangement shown in FIG. 9.

Referring now to FIGS. 9 and 10, it will be seen that when it is desired to accommodate circuit boards of greater depth, two adjacent carriers can be laterally connected by placing the U-shaped coupling bar 152 over the tops (and the bottoms) of the adjacent panels 10 (and 12) with the apertures 158 in the channel 152 being in alignment with the threaded openings 104. The panels are then placed so that the apertures 158 and the threaded openings 104 are between the appropriate guide rails of the frame, and the clips 106 are placed over the rails with the knobs 114 being properly positioned through the clip openings 112, through the channel apertures 158 and fastened into the threaded openings 104 of the panels. Accordingly, two panels 10 and two associated panels 12 are secured together at the top and bottom of each using a total of four coupling bars 152.

In this way, the two laterally positioned carriers are held in place and circuit boards of varied depths can thereby be accommodated. It should be understood that in addition to just coupling together two adjacent panels on each side of the carrier arrangement, it is possible to utilize a longer coupling bar whereby more than two adjacent panels can be coupled together on each side of the carrier arrangement.

Figure 11:
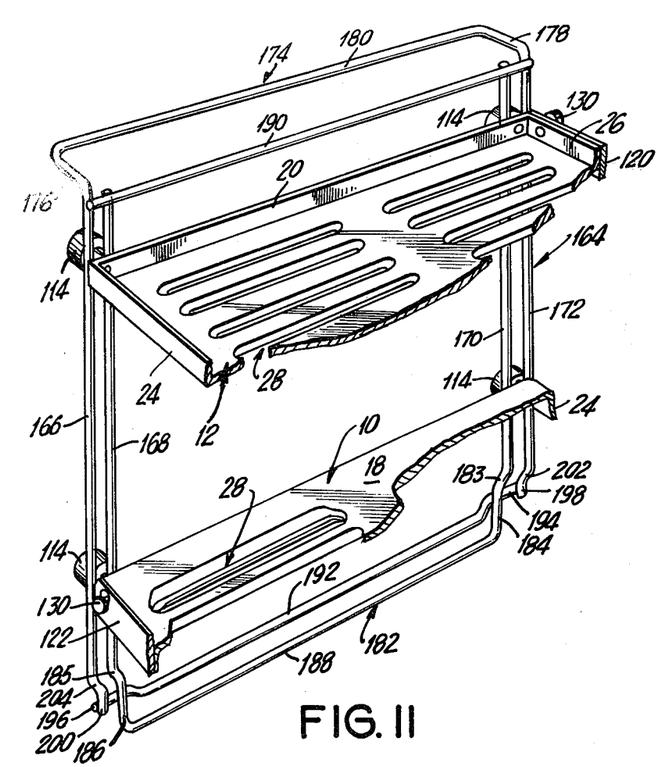
FIG. 11 is a fragmentary perspective view showing another embodiment of the carrier of the present invention.
Figure 12:
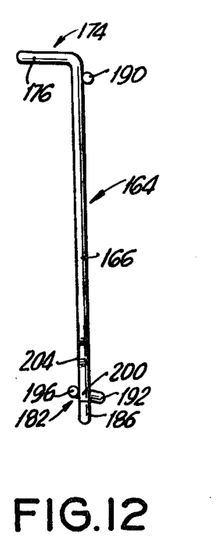
FIG. 12 is an elevational view of the skeletal frame shown in FIG. 11.
Figure 13:
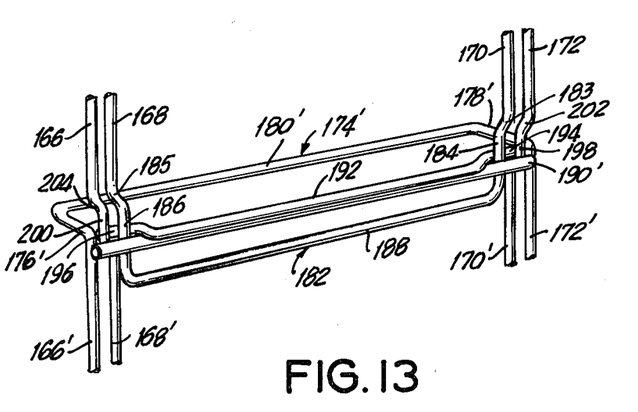
FIG. 13 is a fragmentary perspective view showing the interlocking relationship of the skeletal frames of adjacent stacked carriers in accordance with the embodiment shown in FIG. 11.

Referring now to FIGS. 11–13 another embodiment of the present invention is shown wherein panels 10, 12 are held between adjacent end frames, only one of which is shown at 164. The end frames 164 are substantially identical and include a first pair of spaced apart guide rails 166, 168 forming one side of the frame, and another pair of guide rails 170, 172 forming the other opposing side of the frame. All of the four guide rails 166, 168 and 170, 172 lie in a common plane and the spacing between each of the pair of guide rails is substantially identical.

At the upper end of the frames 164, there is provided a U-shaped handle bar 174 having its legs 176, 178 forming an integral continuation of the outermost guide rails 166, 172. The legs 176, 178 are interconnected by the bight portion 180. It should be noted that the U-shaped handle bar lies perpendicular to the plane of the outermost guide rails 166, 172.

At the lower end, the U-shaped foot 182 is formed by first inwardly bending at 183, 185 the innermost guide rails 168, 170 and then bending the remaining portions downwardly to form the opposing legs 184, 186 of the U-shaped foot which is interconnected by a bight portion 188. An upper straight tie rod 190 overlies the rails 166, 168 and 170, 172 being positioned at the upper ends of the innermost guide rails 168, 170. A corresponding tie rod 192 is spaced inwardly between the downwardly bent legs 184, 186 of the foot with the opposite ends 194, 196 of the rod 192 being bent outwardly for securement against the outside surfaces of the outermost guide rails 166, 172 and the bent legs 184, 186 of the foot. The ends 198, 200 of the outermost rails 166, 172 are first inwardly bent at 202, 204 and the remaining portions are bent downwardly and terminate at the ends 194, 196 of the tie rod 192. It should be appreciated, that the lower U-shaped foot 182 is coplanar with the guide rails 166, 168 and 170, 172 as can best be appreciated in FIG. 12.

In the embodiment shown in FIGS. 11–13, the panels 10, 12 now form the upper and lower portions of the carrier. Accordingly, the knobs 114 extend between the pair of guide rails 166, 168 and 170, 172 and are threaded into the peripheral flanges of the panels 10, 12 in the same manner as set forth above. In the present embodiment, the previously described U-shaped clips are not utilized as best indicated in FIG. 11, however it is understood that these clips could be utilized in this modified embodiment if desired.

In the present embodiment, the printed circuit boards would be inserted between the card guides 28 formed in the upper and lower panels so as to orient the circuit boards in a vertical orientation, and substantially perpendicular to the panels.

The handle bars 174 and the feet 182 again provide versatility in supporting and transporting of the carrier and again a multiplicity of types of supporting arrangements can be provided utilizing the present support devices, in a manner set forth above.

At the same time, the support handles and feet also provide the means for interlocking vertically stacked carriers, as shown in FIG. 13. Specifically, the U-shaped foot 182 of a first carrier is inserted into the handle bar 174' of another carrier vertically stacked therebeneath. Because of the inwardly directed ends 198, 200 of the outermost rails 172, 166 and the inwardly directed legs 184, 186 of the U-shaped foot 182, the ends and legs will fit between the legs 178', 176' forming part of the handle bars 174', with the legs 184, 186 being received between the innermost rails 170', 168' of the bottom carrier. The tie bar 192 interconnecting the feet 182 of the upper carrier will then confrontingly overlie and function to cradle the tie rod 190' which interconnects the handle bars 174' of the bottom carrier. The two tie rods 192, 190' will abut each other to form a stop for the stacked carrier, where the axis of the rod 192 is further inwardly spaced from the side guide rails 166, 168 and 170, 172 than the axis of the rod 190' as shown in FIG. 13 and indicated in FIG. 12.

With the present arrangement, there is provided a great versatility of adjustment of the carriers. Specifically, the arrangement provides accommodating printed circuit boards of different widths, different depths, and facilitates stacking of the various carriers in vertical arrangement. At the same time, it provides support devices for numerous support arrangements for storing, transporting, carrying, and manipulating of the circuit boards with the present carriers. Additionally, because the support serves simultaneously as a supporting device as well as an interlocking arrangement for stacking, the carriers are lightweight, durable, easy to assemble and utilize, and simple to adjust. Furthermore, they are accommodating for all sizes of circuit boards and easily adaptable to various uses.

Preferably, all the members and parts of the above carriers are fabricated from metal, however if desired, the panels could be fabricated from a plastic material, as well as other suitable parts thereof.

Numerous alterations of the structure herein disclosed will suggest themselves to those skilled in the art. However, it is to be understood that the present disclosure relates to a preferred embodiment of the invention which is for purposes of illustration only and is not to be construed as a limitation of the invention.

What is claimed is:

1. A carrier for printed circuit boards, comprising:
   a pair of variably spaced apart opposing panels, each of said panels being of substantially rectangular configuration;
   a plurality of spaced apart elongated guides provided on each panel, correspondingly opposed ones of said guides receiving opposing edges of a circuit board to support the circuit board in substantially perpendicular relationship between the panels;
   a pair of skeletal frames, each of said frames being of substantially rectangular configuration, said frames being disposed on opposite ends of said panels to provide a substantially rectangular unit;
   each of said frames including a spaced apart pair of elongated guide rails disposed at each of the opposing sides of the frame, all four guide rails of each frame lying in a common plane;
   coupling means for adjustably securing corresponding ends of each of said panels, respectively, to said frames for permitting adjustment of the spacing between said panels;
   said coupling means including threaded openings in opposing ends of said panels, and threaded connecting means riding between each pair of guide rails and being received in said threaded openings for retaining said panels secured to said guide rails at a selected position;

integral support means extending from opposing ends of each of said frames for accommodating varied types of support for the carrier;

said support means interconnecting opposing ends of said pairs of guide rails to complete the rectangular configuration of each frame;

said support means permitting one carrier to be interlockingly fitted with respect to another carrier in a stacked relationship;

one of said frames defining an upper frame having its support means including a laterally outwardly extending U-shaped handle bar at each opposing end, and the other of said frames defining a lower frame having its support means including a downwardly extending U-shaped foot at each opposing end with legs of the U-shaped foot being inwardly directed from the sides of the lower frame;

said pairs of guide rails on said upper and lower frames being aligned with each other; and said support means including a tie rod lying on and interconnecting the legs of each U-shaped handle bar and each U-shaped foot, whereby in the stacked relationship, each foot tie rod abuts a respective handle bar tie rod to spacedly stack one carrier onto the next carrier in vertical relationship.

2. A carrier for printed circuit boards as in claim 1, wherein said handle bars are vertically offset from the plane of the guide rails, whereby said carrier can be inverted to use said handle bars as supporting legs.

3. A carrier for printed circuit boards as in claim 1, wherein said panels include a peripheral flange and said threaded connecting means extend through said flange.

4. A carrier for printed circuit boards as in claim 1, wherein said connecting means includes a knob having a threaded stud and a clip for overlying each pair of guide rails, said clip having an aperture therethrough for receiving said threaded stud.

5. A carrier for printed circuit boards as in claim 1, and further comprising a U-shaped channel member having apertures in its bight portion aligned with the spacing between said threaded openings for overlying the peripheral end of said panel and for receiving the threaded connecting means in corresponding apertures, said channel member being of a length to overlie at least two laterally adjacent panels to thereby permit interconnection of two carriers.

6. A carrier for printed circuit boards as in claim 1, wherein said guides include spaced apart lips extending outwardly from a front surface of the panel to define a passageway therebetween through which the circuit boards can be inserted.

7. A carrier for printed circuit boards, comprising:
a pair of variably spaced apart opposing panels, each of said panels being of substantially rectangular configuration;
a plurality of spaced apart elongated guides provided on each panel, correspondingly opposed ones of said guides receiving opposing edges of a circuit board to support the circuit board in substantially perpendicular relationship between the panels;
a pair of skeletal frames, each of said frames being of substantially rectangular configuration, said frames being disposed on opposite ends of said panels to provide a substantially rectangular unit;
each of said frames including a spaced apart pair of elongated guide rails disposed at each of the opposing sides of the frame, all four guide rails of each frame lying in a common plane;

coupling means for adjustably securing corresponding ends of each of said panels, respectively, to said frames for permitting adjustment of the spacing between said panels;

said coupling means including threaded openings in opposing ends of said panels, and threaded connecting means riding between each pair of guide rails and being received in said threaded openings for retaining said panels secured to said guide rails at a selected position;

integral support means extending from opposing ends of each of said frames for accommodating varied types of support for the carrier;

said support means interconnecting opposing ends of said pairs of guide rails to complete the rectangular configuration of each frame;

said support means permitting one carrier to be interlockingly fitted with respect to another carrier in a stacked relationship;

each of said frames defining an end frame having its support means including a laterally outwardly extending U-shaped handle bar at its upper end and a downwardly extending U-shaped foot at its lower end with legs of the U-shaped foot being inwardly directed from the sides of the frame;

said pairs of guide rails on the opposing end frames being aligned with each other; and said support means including a tie rod lying on and interconnecting the legs of each U-shaped handle bar and each U-shaped foot, whereby in the stacked relationship, each foot tie rod abuts a respective handle bar tie rod to spacedly stack one carrier onto the next carrier in vertical relationship.

8. A carrier for printed circuit boards as in claim 7, wherein said U-shaped foot lies in a common plane with the guide rails.

9. A carrier for printed circuit boards as in claim 7, wherein said panels include a peripheral flange and said threaded connecting means extend through said flange.

10. A carrier for printed circuit boards as in claim 7, wherein said connecting means includes a knob having a threaded stud and a clip for overlying each pair of guide rails, said clip having an aperture therethrough for receiving said threaded stud.

11. A carrier for printed circuit boards as in claim 7, and further comprising a U-shaped channel member having apertures in its bight portion aligned with the spacing between said threaded openings for overlying the peripheral end of said panel and for receiving the threaded connecting means in corresponding apertures, said channel member being of a length to overlie at least two laterally adjacent panels to thereby permit interconnection of two carriers.

12. A carrier for printed circuit boards as in claim 7, wherein said guides include spaced apart lips extending outwardly from a front surface of the panel to define a passageway therebetween through which the circuit boards can be inserted.

13. A carrier for printed circuit boards, comprising:
a pair of variably spaced apart opposing panels;
a plurality of spaced apart elongated guides provided on each panel, correspondingly opposed ones of said guides receiving opposing edges of a circuit board to support the circuit board in substantially perpendicular relationship between the panels;
a pair of skeletal frames disposed on opposite ends of said panels to provide a substantially rectangular configuration;

coupling means for adjustably securing corresponding ends of each of said panels, respectively, to said frames for permitting adjustment of the spacing between said panels;

integral support means extending from opposing ends of each of said frames for accommodating varied types of support for the carrier;

retaining means slidably coupled to said panels for retaining the circuit boards in position between said panels;

said panels including a peripheral flange thereabout;

said retaining means including elongated bars substantially commensurate with side flanges of said panels and slidably coupled thereto, said elongated bars being provided with elongated slots perpendicular to the longitudinal axis of the bars and disposed at opposing ends thereof; and means for holding said bars in both a retaining and a release position, said bar holding means including pins loosely extending through said elongated slots and secured to said side flanges, and longitudinally spaced apart dimples inwardly extending from the surface of the bar which can snap forwardly of the side flange edge to hold the bar in its retaining position, and which can ride onto the surface of the side flange to hold the bar in its release position.

14. A carrier for printed circuit boards as in claim 13, and further comprising coupling bars for laterally coupling adjacent panels in a common plane to thereby expand the depth capability of the carrier.

15. A carrier for printed circuit boards as in claim 14, wherein said coupling bars include U-shaped channels fitting over edges of adjacent panels.

16. A carrier for printed circuit boards as in claim 13, and including two of said elongated bars located at diagonally opposed positions with respect to the pair of panels.

* * * * *